US012642114B2

(12) United States Patent
Tsai et al.

(10) Patent No.: US 12,642,114 B2
(45) Date of Patent: May 26, 2026

(54) ELECTRONIC PACKAGE AND CIRCUIT STRUCTURE THEREOF

(71) Applicant: SILICONWARE PRECISION INDUSTRIES CO., LTD., Taichung City (TW)

(72) Inventors: Fang-Lin Tsai, Taichung City (TW); Wei-Son Tsai, Taichung City (TW); Kun-Yuan Luo, Taichung City (TW); Pei-Geng Weng, Taichung City (TW); Ching-Hung Tseng, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 375 days.

(21) Appl. No.: 18/345,426

(22) Filed: Jun. 30, 2023

(65) Prior Publication Data

US 2024/0312889 A1       Sep. 19, 2024

(30) Foreign Application Priority Data

Mar. 17, 2023     (TW) ................................. 112110077

(51) Int. Cl.
| | |
|---|---|
| *H10W 70/65* | (2026.01) |
| *H10W 70/685* | (2026.01) |
| *H10W 74/10* | (2026.01) |
| *H10W 70/655* | (2026.01) |
| *H10W 90/00* | (2026.01) |

(52) U.S. Cl.
CPC ......... *H10W 70/65* (2026.01); *H10W 70/685* (2026.01); *H10W 74/111* (2026.01); *H10W 70/655* (2026.01); *H10W 90/725* (2026.01)

(58) Field of Classification Search
None
See application file for complete search history.

(56) References Cited

U.S. PATENT DOCUMENTS

| | | | | |
|---|---|---|---|---|
| 10,170,439 B1* | 1/2019 | Khor | ...................... | H10W 20/43 |
| 2008/0030410 A1* | 2/2008 | Ying | ...................... | H01Q 1/243 |
| | | | | 343/702 |
| 2011/0242863 A1* | 10/2011 | Park | ......................... | H01Q 5/40 |
| | | | | 363/126 |
| 2014/0055965 A1* | 2/2014 | Kitajima | .................. | H05K 7/06 |
| | | | | 361/752 |
| 2022/0165698 A1* | 5/2022 | Kim | ...................... | H10W 70/685 |
| 2023/0317641 A1* | 10/2023 | Lai | ......................... | H10D 1/692 |
| | | | | 257/690 |
| 2024/0006747 A1* | 1/2024 | Brinlee | ................ | H01Q 9/0407 |

* cited by examiner

*Primary Examiner* — Cory W Eskridge
(74) *Attorney, Agent, or Firm* — Dority & Manning, PA

(57) ABSTRACT

An electronic package and a circuit structure thereof are provided, in which a circuit layer and an electrical function part are formed on a dielectric layer of the circuit structure, and the dielectric layer has at least one corner at a right angle, where a shape of the electrical function part at the corner and corresponding to the right angle is of a non-right angle shape and/or a routing path of the circuit layer at the corner and corresponding to the right angle is of a non-right angle shape, so that stress concentration can be reduced, thereby preventing the electronic package from warping.

10 Claims, 5 Drawing Sheets

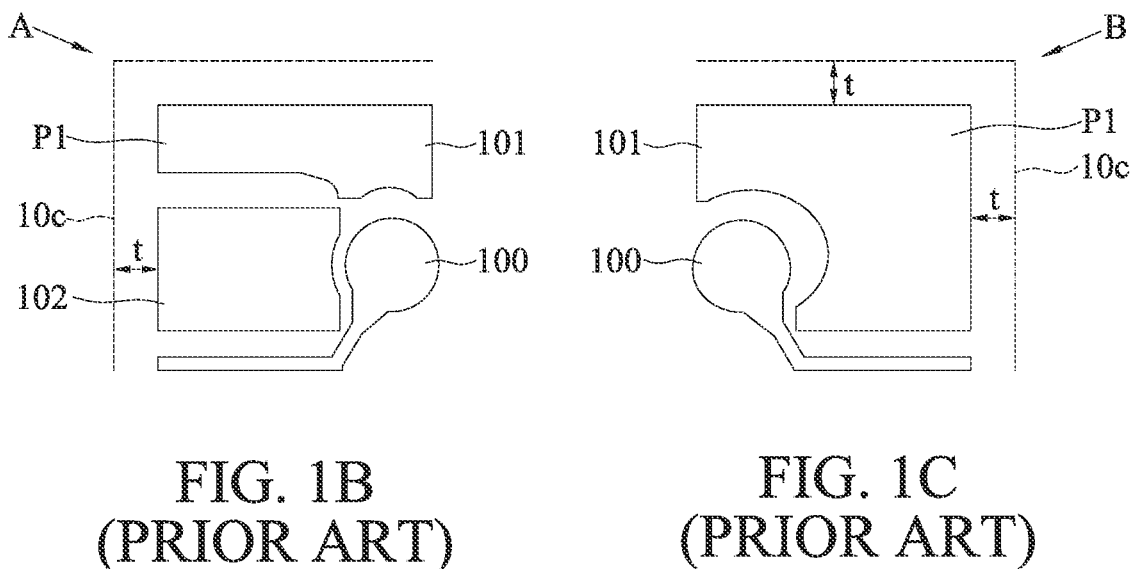
FIG. 1B
(PRIOR ART)
FIG. 1C
(PRIOR ART)
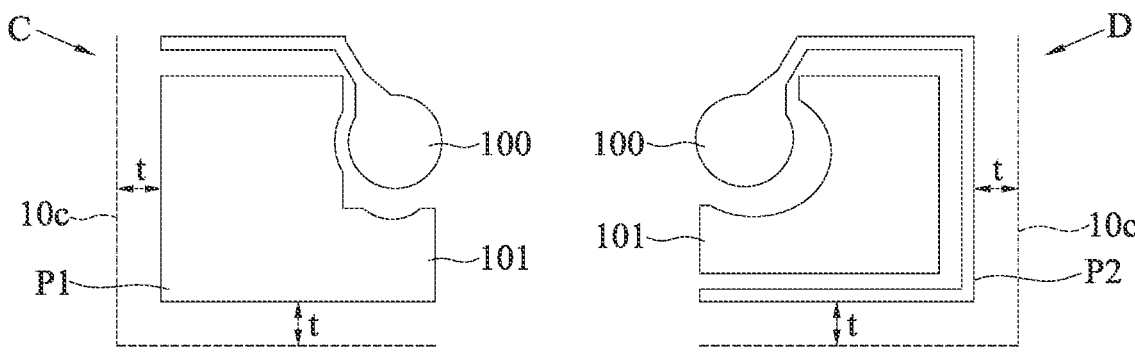
FIG. 1D
(PRIOR ART)
FIG. 1E
(PRIOR ART)

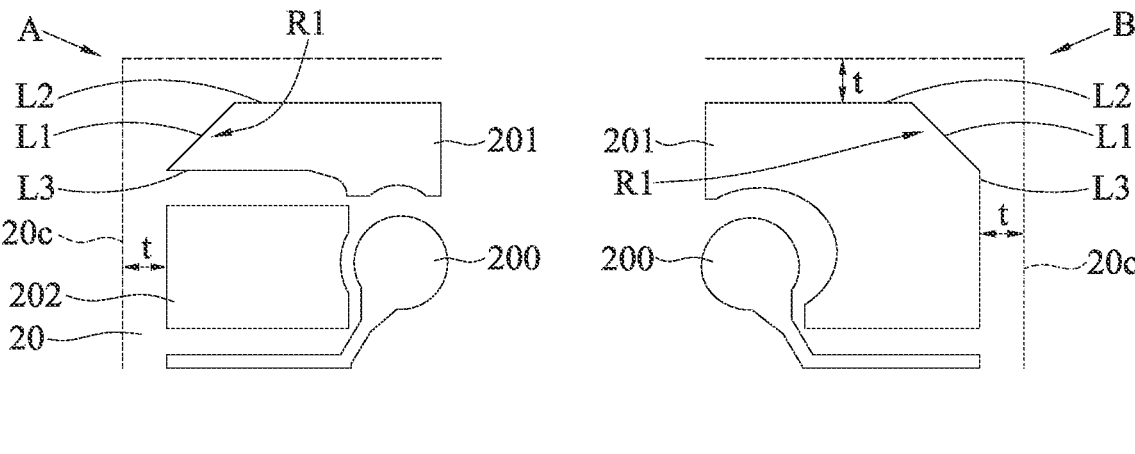
FIG. 2B                    FIG. 2C
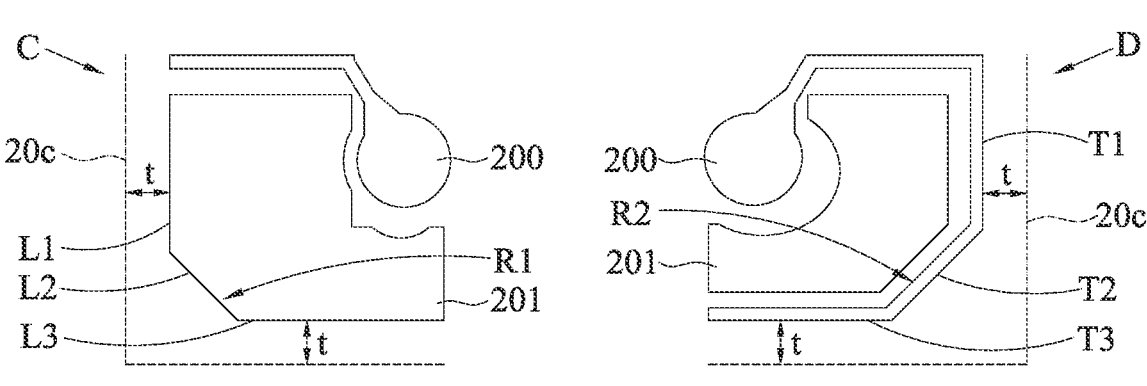
FIG. 2D                    FIG. 2E

ELECTRONIC PACKAGE AND CIRCUIT STRUCTURE THEREOF

BACKGROUND

1. Technical Field

The present disclosure relates to a semiconductor packaging technology, and more particularly, to an electronic package and a circuit structure thereof.

2. Description of Related Art

With the development of the electronics industry toward high-performance computing (HPC), such as the development of medical technology, the development of cancer drugs, the automatic sensing detection computing of self-driving cars, etc., many high-end electronic products are primary based on high-integration packaging technology (e.g., fan-out packaging).

FIG. 1A is a schematic top view showing a conventional semiconductor package 1. As shown in FIG. 1A, the semiconductor package 1 includes: a packaging substrate 10, a semiconductor chip 11 flip-chip bonded on the packaging substrate 10, and a packaging colloid (not shown) covering the semiconductor chip 11.

Referring to FIG. 1B to FIG. 1E at the same time, the packaging substrate 10 is a rectangular board with a routing region (e.g., a wiring/tracing region) on its surface to form a circuit layer 100 electrically connected to the semiconductor chip 11.

Moreover, stress concentration regions are prone to be generated around the position where the semiconductor chip 11 is disposed on the packaging substrate 10, such as corners A, B, C, D; and the closer to the corners A, B, C, D, the more concentrated the stress is. Hence, at the corners A, B, C, D, at least one large area of metal sheet 101, 102 is usually formed on an open region around the circuit layer 100 of the routing region, as shown in FIG. 1B to FIG. 1E, so as to disperse the stress.

Furthermore, there is no signal transmission between the metal sheets 101, 102 and the semiconductor chip 11, and the metal sheets 101, 102 are not beyond the routing region, such that a certain distance t is kept between the metal sheets 101, 102 and an edge 10c of the packaging substrate 10.

With the requirements of multi-chip, high number of layers of redistribution layer (RDL), large dimension and high heat dissipation design, etc., multiple semiconductor chips 11 and other accessories will be carried on the packaging substrate 10.

However, the shapes of the conventional metal sheets 101, 102 corresponding to the right angles of the corners A, B, C or the routing path of the circuit layer 100 corresponding to the right angle of the corner D are in right-angle shapes P1, P2. Therefore, when the semiconductor package 1 is encountered with temperature cycle or stress changes, the stress is prone to concentrate on the metal sheets 101, 102, causing the packaging substrate 10 to warp and even causing the metal sheets 101, 102 to break, which would crack the packaging substrate 10 or break the semiconductor chip 11, thereby reducing the product yield.

Therefore, how to overcome the problems of the above-mentioned prior art has become an urgent problem to be solved at present.

SUMMARY

In view of the aforementioned shortcomings of the prior art, the present disclosure provides a circuit structure, which comprises: a dielectric layer having at least one corner at a right angle; a circuit layer formed on the dielectric layer and at the corner of the dielectric layer; and an electrical function part disposed at the corner of the dielectric layer, wherein a shape of the electrical function part at the corner and corresponding to the right angle is of a non-right angle shape and/or a routing path of the circuit layer at the corner and corresponding to the right angle is of a non-right angle shape.

In the aforementioned circuit structure, the non-right angle shape is a cut shape, an arc chamfer shape, or a multi-corner shape.

In the aforementioned circuit structure, the electrical function part is a metal sheet.

In the aforementioned circuit structure, the dielectric layer comprises a plurality of layers, and the circuit layer and/or the electrical function part are formed between any two adjacent ones of the plurality of dielectric layers.

In the aforementioned circuit structure, the dielectric layer has a rectangular surface having the four corners at right angles.

The present disclosure also provides an electronic package, which comprises: the aforementioned circuit structure; and an electronic element disposed on the circuit structure and electrically connected to the circuit layer.

In the aforementioned electronic package, the electronic element is grounded to the electrical function part.

In the aforementioned electronic package, the electrical function part has a dummy circuit function.

In the aforementioned electronic package, signal is free from being transmitted between the electrical function part and the electronic element.

In the aforementioned electronic package, the present disclosure further comprises an encapsulation layer covering the electronic element.

It can be seen from the above that in the electronic package and the circuit structure thereof of the present disclosure, the stress can be dispersed and the stress concentration can be reduced by the design of the non-right angle shapes of the electrical function parts corresponding to the right angles at the corners and/or the design of the non-right angle shape of the routing path of the circuit layer corresponding to the right angle at the corner. Therefore, compared with the prior art, warpage can be prevented from occurring to the circuit structure in the electronic package of the present disclosure, and problems such as the breakage of the electrical function parts that causes the cracking of the circuit structure or the breakage of the electronic element can also be avoided, so that the circuit layer can be effectively electrically connected to the electronic element, thereby improving product yield and product reliability.

BRIEF DESCRIPTION OF THE DRAWINGS

FIG. 1B to FIG. 1E are schematic partial enlarged top views showing each corner of the packaging substrate of FIG. 1A.

FIG. 2B to FIG. 2E are schematic partial enlarged top views showing each corner of the circuit structure of FIG. 2A.

DETAILED DESCRIPTION

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "on," "first," "second," "a," "one," and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

Figure 1A:
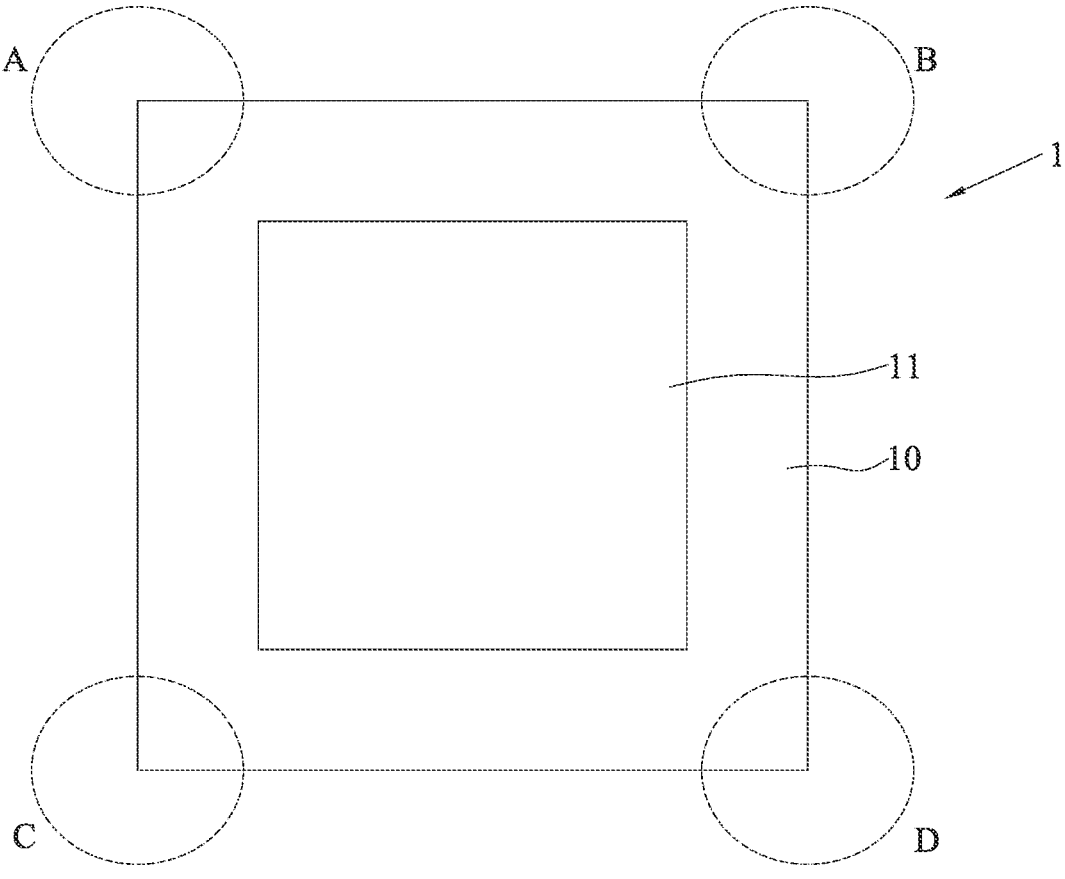
FIG. 1A is a schematic top view showing a conventional semiconductor package.
Figure 2A:
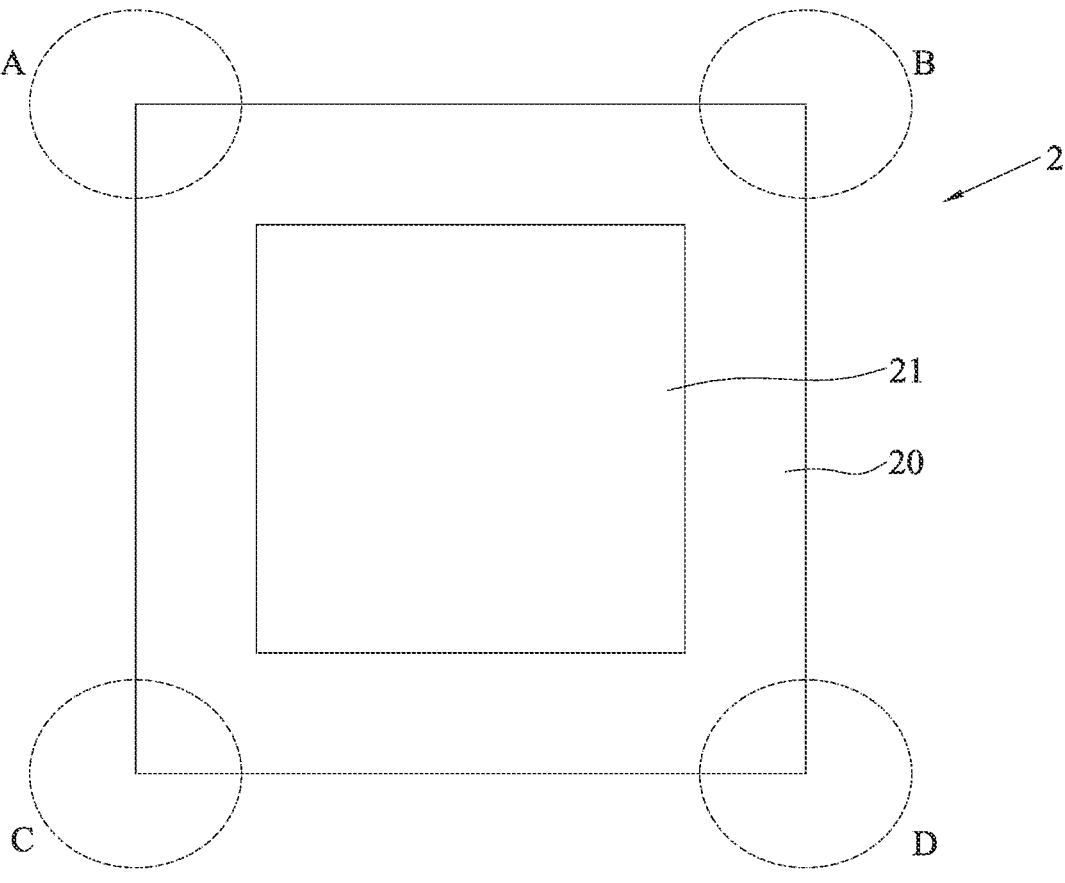
FIG. 2A is a schematic top view showing an electronic package of the present disclosure.

FIG. 2A is a schematic top view showing an electronic package 2 of the present disclosure. As shown in FIG. 2A, the electronic package 2 comprises: a circuit structure 20, at least one electronic element 21 disposed on the circuit structure 20, and an encapsulation layer 23 (shown in FIG. 3B) covering the electronic element 21.

The circuit structure 20 is a rectangular board, and a surface of the circuit structure 20 is defined with a routing region (e.g., a wiring/tracing region) for disposing the electronic element 21 and four corners A, B, C, D. As shown in FIG. 2B to FIG. 2E, the routing region and the four corners A, B, C, D are configured with a circuit layer 200, and at least one electrical function part 201, 202 having a function of a dummy RDL or a dummy metal block is disposed at each of the four corners A, B, C, D.

In an embodiment, the circuit structure 20 is, for example, a packaging substrate with a core layer, or a coreless packaging substrate. The circuit structure 20 comprises at least one dielectric layer 20a (as shown in FIG. 3B) and the circuit layer 200 and the electrical function parts 201, 202 bonded to the dielectric layer 20a. For instance, an RDL process is used for the circuit structure 20, and the material for forming the circuit layer 200 and the electrical function parts 201, 202 is a metal such as copper, and the material for forming the dielectric layer 20a is polybenzoxazole (PBO), polyimide (PI), prepreg (PP), or other dielectric materials.

Moreover, the electrical function parts 201, 202 are metal sheets, and signal can be free from being transmitted between the electrical function parts 201, 202 and the electronic element 21 according to requirements, and the electrical function parts 201, 202 are not beyond the routing region, such that a certain distance t is kept between the electrical function parts 201, 202 and an edge 20c of the circuit structure 20.

Furthermore, the electrical function parts 201, 202 at the corners A, B, C of the circuit structure 20 and corresponding to the right angles are of non-right angle shapes, such as a cut shape R1 shown in FIG. 2B to FIG. 2D, so that the shapes of the electrical function parts 201, 202 corresponding to the right angles of the corners A, B, C have at least three lines L1, L2, L3 so as to facilitate stress dispersion. It should be understood that there are various aspects of the non-right angle shapes, such as an arc chamfer shape or a multi-corner shape (not shown), but the present disclosure is not limited to as such.

Similarly, the routing path of the circuit layer 200 at the corner D of the circuit structure 20 and corresponding to the right angle is of a non-right angle shape, such as a cut shape R2 shown in FIG. 2E, so that the routing path of the circuit layer 200 corresponding to the right angle of the corner D has at least three connected traces T1, T2, T3 so as to facilitate stress dispersion. It should be understood that there are various aspects of the non-right angle shapes, such as an arc chamfer shape or a multi-corner shape (not shown), but the present disclosure is not limited to as such.

Additionally, referring to FIG. 3B at the same time, when the circuit structure 20 comprises multiple dielectric layers 20a, 20b, a circuit layer 300 and the electrical function parts 201, 202 of non-right angle shapes at the corners A, B, C, D can also be disposed on any one of the dielectric layers 20a, 20b (i.e., not limited to the outermost circuit layer 200 and electrical function parts 201, 202).

The electronic element 21 is an active element, a passive element, or a combination of the active element and the passive element, wherein the active element is a semiconductor chip, and the passive element is a resistor, a capacitor, or an inductor.

In an embodiment, the electronic element 21 is a semiconductor chip, which is electrically connected to the circuit layer 200 via a plurality of conductive bumps 210 (as shown in FIG. 3B) in a flip-chip manner; alternatively, the electronic element 21 can also be electrically connected to the circuit layer 200 via a plurality of bonding wires (not shown) in a wire-bonding manner; or, the electronic element 21 can directly contact the circuit layer 200 to electrically connect the circuit layer 200. However, the way in which the electronic element 21 is electrically connected to the circuit layer 200 is not limited to the above.

Moreover, the electronic element 21 can be grounded to the electrical function parts 201, 202 according to requirements. Thus, the functions of the electrical function parts 201, 202 can be adjusted according to requirements without any special limitation.

The encapsulation layer 23 is made of an insulating material, such as PI, dry film, epoxy resin, epoxy colloid, or molding compound, and the encapsulation layer 23 can be formed on the circuit structure 20 by lamination or molding.

Therefore, in the circuit structure 20, the shapes of the electrical function parts 201, 202 at the corners A, B, C and corresponding to the right angles are of non-right angle shapes and/or the routing path of the circuit layer 200 at the corner D and corresponding to the right angle is of a non-right angle shape, such as the cut shapes R1, R2 shown in FIG. 2B to FIG. 2E, so that stress can be effectively prevented from concentrating at the right angles of the metal layer.

Figure 3A:
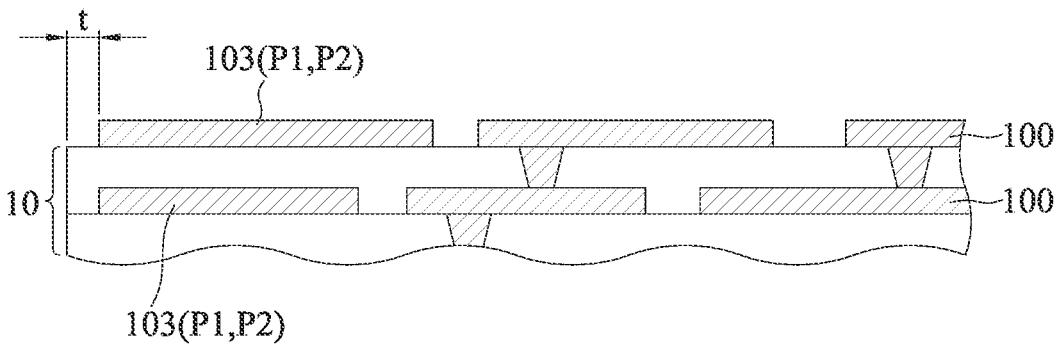
FIG. 3A is a schematic partial cross-sectional view showing a conventional semiconductor package.
Figure 3B:
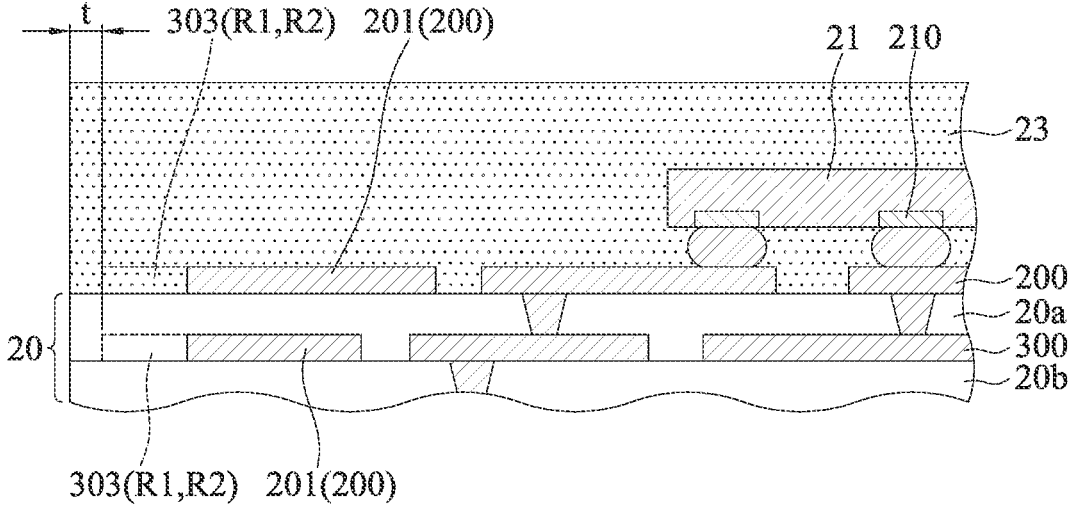
FIG. 3B is a schematic partial cross-sectional view showing an electronic package of the present disclosure.

Furthermore, since the shapes of the electrical function parts 201, 202 at the corners A, B, C and corresponding to the right angles are of non-right angle shapes and/or the routing path of the circuit layer 200 at the corner D and corresponding to the right angle is of a non-right angle shape (such as the cut shapes R1, R2 shown in FIG. 2B to FIG. 2E), the amount of metal laying at the corners A, B, C, D in the electronic package 2 can be reduced (for example, the metal can be a conventional metal sheet or a metal material 103 represented by an RDL as shown in FIG. 3A, and a removed metal material 303 represented by the dotted lines as shown in FIG. 3B). That is, the areas of the open regions (i.e., the regions with no metal material) at the corners A, B, C, D are increased, so that the resistance of the PI material (dielectric layer) and the metal material (circuit layer) to the peeling stress is increased, such that the upper dielectric layer 20a and the lower dielectric layer 20b can be tightly bonded (i.e., the adhesion between the same material of the high polymer layers is much better than the adhesion between the high polymer layer and the metal layer). As such, the problem of delamination can be prevented from occurring between the upper dielectric layer 20a and the lower circuit layer 300.

In addition, the design of the non-right angle shapes of the electrical function parts 201, 202 corresponding to the right angles at the corners A, B, C and/or the design of the non-right angle shape of the routing path of the circuit layer 200 corresponding to the right angle at the corner D can be realized by using the existing manufacturing process and existing equipment without adding additional manufacturing cost and time, thereby facilitating mass production.

To sum up, in the electronic package and the circuit structure thereof of the present disclosure, the stress can be dispersed and the stress concentration can be reduced by the design of the non-right angle shapes of the electrical function parts corresponding to the right angles at the corners and/or the design of the non-right angle shape of the routing path of the circuit layer corresponding to the right angle at the corner. Therefore, warpage can be prevented from occurring to the circuit structure in the electronic package of the present disclosure, and problems such as the breakage of the electrical function parts that causes the cracking of the circuit structure or the breakage of the electronic element can also be avoided, so that the circuit layer can be effectively electrically connected to the electronic element, thereby improving product yield and product reliability.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A circuit structure, comprising:
   a dielectric layer having at least one corner at a right angle;
   a circuit layer formed on the dielectric layer and at the corner of the dielectric layer; and
   an electrical function part disposed at the corner of the dielectric layer, wherein a shape of the electrical function part at the corner and corresponding to the right angle is of a non-right angle shape and a routing path of the circuit layer at the corner and corresponding to the right angle is of a non-right angle shape, and the routing path of the circuit layer corresponding to the right angle of the corner has at least three connected traces.

2. The circuit structure of claim 1, wherein the non-right angle shape is a cut shape, an arc chamfer shape, or a multi-corner shape.

3. The circuit structure of claim 1, wherein the electrical function part is a metal sheet.

4. The circuit structure of claim 1, wherein the dielectric layer comprises a plurality of layers, and the circuit layer and/or the electrical function part are formed between any two adjacent ones of the plurality of dielectric layers.

5. The circuit structure of claim 1, wherein the dielectric layer has a rectangular surface having the four corners at right angles.

6. An electronic package, comprising:
   the circuit structure of claim 1; and
   an electronic element disposed on the circuit structure and electrically connected to the circuit layer.

7. The electronic package of claim 6, wherein the electronic element is grounded to the electrical function part.

8. The electronic package of claim 6, wherein the electrical function part has a dummy circuit function.

9. The electronic package of claim 6, wherein a signal is free from being transmitted between the electrical function part and the electronic element.

10. The electronic package of claim 6, further comprising an encapsulation layer covering the electronic element.

\*    \*    \*    \*    \*